US006316737B1

(12) United States Patent
Evans et al.

(10) Patent No.: US 6,316,737 B1
(45) Date of Patent: Nov. 13, 2001

(54) MAKING A CONNECTION BETWEEN A COMPONENT AND A CIRCUIT BOARD

(75) Inventors: Michael D. Evans, Lexington; James D. Goss, Norwood; Jeffrey A. Curhan, Upton; Patrizio Vinciarelli, Boston, all of MA (US)

(73) Assignee: VLT Corporation, San Antonio, TX (US)

( * ) Notice: Subject to any disclaimer, the term of this patent is extended or adjusted under 35 U.S.C. 154(b) by 0 days.

(21) Appl. No.: 09/393,952

(22) Filed: Sep. 9, 1999

(51) Int. Cl.[7] ........................................................ H05K 1/16
(52) U.S. Cl. .................... 174/260; 174/261; 174/262; 174/263; 361/760; 361/772; 361/773; 361/779; 257/698; 257/779
(58) Field of Search ........................................ 174/260, 262, 174/263, 266, 261, 52.1, 52.4; 361/760, 768, 772, 773, 774; 257/773, 775, 779, 786, 713, 698, 690, 772

(56) References Cited

U.S. PATENT DOCUMENTS

| 3,429,040 | 2/1969 | Miller ................................. 29/626 |
| 3,621,338 | 11/1971 | Rogers et al. ...................... 317/101 |
| 3,683,241 | 8/1972 | Duncan ............................... 317/234 |
| 3,737,729 | 6/1973 | Carney ............................... 317/101 |
| 3,766,440 | 10/1973 | Baird .................................. 317/100 |
| 3,769,702 | 11/1973 | Scarbrough ......................... 29/627 |
| 3,805,117 | 4/1974 | Hausman ...................... 317/101 CP |
| 3,900,770 | 8/1975 | Kaufman ......................... 317/148.5 |
| 4,156,148 | 5/1979 | Kaufman ............................ 250/551 |
| 4,196,411 | 4/1980 | Kaufman ............................ 338/314 |
| 4,215,235 | 7/1980 | Kaufman ............................. 174/52 |
| 4,218,724 | 8/1980 | Kaufman ............................ 361/395 |
| 4,250,481 | 2/1981 | Kaufman ............................ 338/163 |
| 4,257,091 | 3/1981 | Kaufman ............................. 363/85 |
| 4,266,140 | 5/1981 | Kaufman ............................ 250/551 |
| 4,278,990 | 7/1981 | Fichot ................................. 357/81 |
| 4,315,175 | 2/1982 | Hamilton ............................. 357/81 |
| 4,394,530 | 7/1983 | Kaufman ............................. 174/16 |
| 4,400,762 | 8/1983 | Bartley et al. ..................... 361/402 |
| 4,417,296 | 11/1983 | Schelhorn ........................ 361/386 |
| 4,449,165 | 5/1984 | Kaufman ........................... 361/386 |
| 4,449,292 | 5/1984 | Kaufman ............................. 29/631 |
| 4,488,202 | 12/1984 | Kaufman ........................... 361/386 |
| 4,498,120 | 2/1985 | Kaufman ........................... 361/386 |
| 4,531,145 | 7/1985 | Wiech, Jr. ............................ 357/81 |
| 4,546,410 | 10/1985 | Kaufman ........................... 361/387 |
| 4,546,411 | 10/1985 | Kaufman ........................... 361/387 |

(List continued on next page.)

FOREIGN PATENT DOCUMENTS

| 1 127 179 | 4/1962 | (DE) . |
| 2840514 | 3/1979 | (DE) . |

(List continued on next page.)

OTHER PUBLICATIONS

Gates and Yokoro; "Sealed Chip–On–Board Circuit Protection"; 3rd International SAMPE Electronics Conference; Jun. 20–22, 1989; pp. 929–938.

"Flexible Applique Attachment for SMT Resistors and Capacitors", IBM Technical Disclosure Bulletin, vol. 34, No. 12, May 1, 1992, pp. 207–208.

Nickols et al., "Fabricating Charge Plate Conductor and Charge Tunnel", IBM Technical Disclosure Bulletin, vol. 19, No. 12, May 1977, p. 4752.

Direct Metal Bonding, 08/336,994, Filed Nov. 10, 1994, John R. Saxelbey, Jr., et al.

*Primary Examiner*—Jeffrey Gaffin
*Assistant Examiner*—I B Patel
(74) *Attorney, Agent, or Firm*—Fish & Richardson P.C.

(57) ABSTRACT

In general, in one aspect, the invention features a connection between a through-hole in a circuit board and a contact region on a component. The contact region has a surface bearing a depression. A continuous solder column has one end of that forms a solder joint with an inner wall of the through-hole and the other end of that forms a solder joint with the contact region.

5 Claims, 2 Drawing Sheets

U.S. PATENT DOCUMENTS

| | | |
|---|---|---|
| 4,551,746 | 11/1985 | Gilbert et al. ............................ 357/74 |
| 4,551,747 | 11/1985 | Gilbert et al. ............................ 357/74 |
| 4,554,613 | 11/1985 | Kaufman ................................ 361/386 |
| 4,574,162 | 3/1986 | Kaufman .................................. 174/16 |
| 4,577,387 | 3/1986 | Kaufman .................................. 29/458 |
| 4,649,461 | 3/1987 | Matsuta ................................. 361/415 |
| 4,650,107 | 3/1987 | Keser ..................................... 228/123 |
| 4,691,265 | 9/1987 | Calver et al. ........................... 361/386 |
| 4,724,283 | 2/1988 | Shimada et al. ...................... 174/68.5 |
| 4,724,514 | 2/1988 | Kaufman ................................ 361/388 |
| 4,736,520 | 4/1988 | Morris ..................................... 29/827 |
| 4,740,414 | 4/1988 | Shaheen ................................ 428/210 |
| 4,750,089 | 6/1988 | Derryberry et al. .................. 361/388 |
| 4,750,092 | 6/1988 | Werther ................................. 361/400 |
| 4,769,525 | 9/1988 | Leatham ................................ 219/209 |
| 4,783,695 | 11/1988 | Eichelberger et al. ................. 357/65 |
| 4,783,697 | 11/1988 | Benenati et al. ........................ 357/80 |
| 4,789,760 | * 12/1988 | Koyama et al. ....................... 174/264 |
| 4,793,543 | 12/1988 | Gainey et al. ......................... 228/121 |
| 4,823,235 | 4/1989 | Suzuki et al. .......................... 361/395 |
| 4,840,286 | 6/1989 | Heberling et al. .................... 361/386 |
| 4,847,136 | 7/1989 | Lo .......................................... 428/195 |
| 4,872,081 | 10/1989 | Murphy et al. ........................ 361/117 |
| 4,879,630 | 11/1989 | Boucard et al. ....................... 361/306 |
| 4,899,257 | 2/1990 | Yamamoto ............................ 220/306 |
| 4,918,811 | 4/1990 | Eichelberger et al. .................. 29/840 |
| 4,940,181 | * 7/1990 | Juskey, Jr. et al. .............. 228/180.21 |
| 4,953,005 | 8/1990 | Carlson et al. . |
| 4,985,097 | 1/1991 | Matsumura et al. .................... 156/87 |
| 4,990,490 | 2/1991 | Pathare et al. .......................... 156/87 |
| 4,994,215 | 2/1991 | Wiech, Jr. ............................... 264/27 |
| 4,996,116 | 2/1991 | Webster et al. ....................... 428/627 |
| 5,001,603 | 3/1991 | Villaneuva, III et al. ............ 361/394 |
| 5,006,673 | 4/1991 | Freyman et al. ...................... 174/255 |
| 5,019,941 | 5/1991 | Craft ...................................... 361/386 |
| 5,019,946 | 5/1991 | Eichelberger et al. ................ 361/414 |
| 5,028,987 | 7/1991 | Neugebauer et al. ................... 357/80 |
| 5,111,362 | 5/1992 | Flamm et al. ......................... 361/395 |
| 5,159,433 | 10/1992 | Kazami et al. .......................... 357/75 |
| 5,176,309 | 1/1993 | Horiguchi et al. .................... 228/122 |
| 5,196,726 | * 3/1993 | Nishiguchi et al. ................... 257/737 |
| 5,206,986 | 5/1993 | Arai et al. ............................... 29/840 |
| 5,216,279 | 6/1993 | Nakao .................................... 257/712 |
| 5,258,888 | 11/1993 | Korinsky ............................... 361/704 |
| 5,271,548 | 12/1993 | Maiwald ................................ 228/175 |
| 5,280,850 | 1/1994 | Hoirguchi et al. ................. 228/122.1 |
| 5,296,735 | 3/1994 | Fukunaga .............................. 257/659 |
| 5,324,890 | 6/1994 | Lawlyes ............................... 174/52.4 |
| 5,328,751 | 7/1994 | Komorita et al. ..................... 428/209 |
| 5,329,423 | * 7/1994 | Scholz ................................... 361/760 |
| 5,365,403 | 11/1994 | Vinciarelli et al. ................... 361/707 |
| 5,372,295 | 12/1994 | Abe et al. ........................... 228/123.1 |
| 5,375,322 | 12/1994 | Leeb ........................................ 29/846 |
| 5,447,267 | 9/1995 | Sakai et al. ........................... 228/175 |
| 5,451,722 | * 9/1995 | Gregoire ............................... 174/261 |
| 5,470,787 | * 11/1995 | Greer ..................................... 438/614 |
| 5,525,065 | * 6/1996 | Sobhani .................................. 439/67 |
| 5,526,234 | 6/1996 | Vinciarelli et al. ................... 361/740 |
| 5,644,103 | 7/1997 | Pullen et al. .......................... 228/175 |
| 5,663,869 | 9/1997 | Vinciarelli et al. ................... 361/707 |
| 5,778,526 | 7/1998 | Vinciarelli et al. ..................... 29/840 |
| 5,796,591 | * 8/1998 | Dalal et al. ............................ 361/779 |
| 5,808,358 | 9/1998 | Vinciarelli et al. ................... 257/700 |
| 5,906,310 | 5/1999 | Vinciarelli et al. ................... 228/123 |
| 5,929,510 | 7/1999 | Geller et al. ........................... 257/635 |
| 6,100,475 | * 8/2000 | Degani et al. ......................... 174/264 |
| 6,172,422 | * 1/2001 | Chigawa et al. ...................... 257/778 |

FOREIGN PATENT DOCUMENTS

| | | | |
|---|---|---|---|
| 3323604 | 1/1985 | (DE) . | |
| 9100467 | 5/1992 | (DE) . | |
| 9217155.9 | 2/1993 | (DE) . | |
| 0141582 | 5/1985 | (EP) . | |
| 0 264 122 A1 | 4/1988 | (EP) . | |
| 0 577 484 A1 | 1/1994 | (EP) . | |
| 2 248 345 | 1/1992 | (GB) . | |
| 50-103452 | 8/1975 | (JP) . | |
| 51-9459 | 3/1976 | (JP) . | |
| 52-11769 | 1/1977 | (JP) . | |
| 54-8462 | 1/1979 | (JP) . | |
| 54-77379 | 6/1979 | (JP) . | |
| 57-19076 | 11/1982 | (JP) . | |
| 57-53948 | 3/1983 | (JP) . | |
| 60-260192 | 12/1985 | (JP) . | |
| 61-156791 | 7/1986 | (JP) . | |
| 61-177762 | 8/1986 | (JP) . | |
| 62-55363 | 4/1987 | (JP) | ................ H05K/1/11 |
| 63-119242 | 5/1988 | (JP) . | |
| 63-114095 | 7/1988 | (JP) . | |
| 63-2733798 | 11/1988 | (JP) . | |
| 1-117087 | 5/1989 | (JP) | ................ H05K/1/18 |
| 1-161892 | 6/1989 | (JP) . | |
| 2-192792 | 7/1990 | (JP) . | |
| 2-232986 | 9/1990 | (JP) | ................ H05K/1/11 |
| 4-83367 | 3/1992 | (JP) . | |
| 04287396 | 10/1992 | (JP) . | |
| 4-346260 | 12/1992 | (JP) . | |
| 05129515 | 5/1993 | (JP) . | |
| 5-206606 | 8/1993 | (JP) | ................ H05K/1/14 |
| 5-347475 | 12/1993 | (JP) . | |
| 6-23534 | 2/1994 | (JP) . | |
| 6-45720 | 2/1994 | (JP) | ................ H05K/1/14 |
| 6-48851 | 2/1994 | (JP) . | |
| 6-90083 | 3/1994 | (JP) . | |
| 7-202475 | 8/1995 | (JP) . | |
| 7-254781 | 10/1995 | (JP) . | |
| 94 03038 | 3/1994 | (WO) . | |

* cited by examiner

MAKING A CONNECTION BETWEEN A COMPONENT AND A CIRCUIT BOARD

BACKGROUND

This invention relates to making a connection between a component and a circuit board.

U.S. Pat. No. 5,644,103, incorporated by reference, shows two ways to make a soldered connection between conductive runs on an electrical component such as in integrated power device (IPD) and a circuit board.

As shown in FIG. 1 (reproduced from FIG. 9 of the patent), in one approach solder 79 connects the inner wall of a metal-lined-through-hole 45a in a circuit board 17 to the surface of a pad 71 that lies on the IPD. The connection is made by reflowing solder using heat from a heat plate 81 or heat stored in base plate 15 of the IPD. In another approach, shown in FIG. 2 (reproduced from FIG. 12 of the patent), hole 45a is replaced by a scallop 83 at the edge of a component hole 45. The scallop permits the solder to form a filleted joint 87.

SUMMARY

In general, in one aspect, the invention features a connection between a through-hole in a circuit board and a contact region on a component. The contact region has a surface that bears a depression. A continuous solder column has one end that forms a solder joint with an inner wall of the through-hole and another end that forms a solder joint with the contact region.

Implementations of the invention may include one or more of the following features. The contact region may include a concave curved depression in the surface of the connection pad. The contact region may be formed on a connection pad, and the depression may have a depth that is at least ¾ of the thickness of the connection pad. The component may be an IPD coated with parylene. The contact may be formed by laser ablation. The solder column may be formed by placing a volume of solder in the through-hole and reflowing the solder in the through-hole to cause it to form a solder joint with an inner wall of the through-hole and a solder joint with the contact region.

ADVANTAGES

Among the advantages of the invention are one or more of the following.

The connections are mechanically strong and resistant to breaking under shear forces that may occur during fabrication and use of the associated circuit. The position and quality of the connections are uniform from unit to unit. Consistent volumes of solder are used from unit to unit. The connections are strong and long-lasting.

Other advantages and features will become apparent from the following description and from the claims.

DETAILED DESCRIPTIONS

Figure 1:
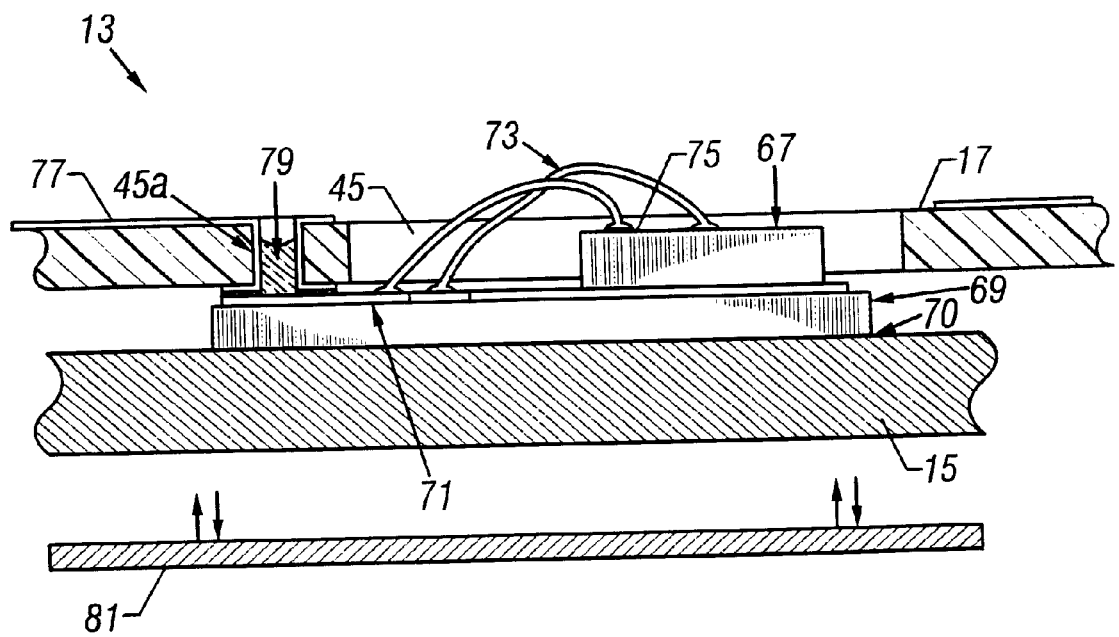
FIGS. 1 and 2 are side sectional views of mounting schemes for IPDs.
Figure 2:
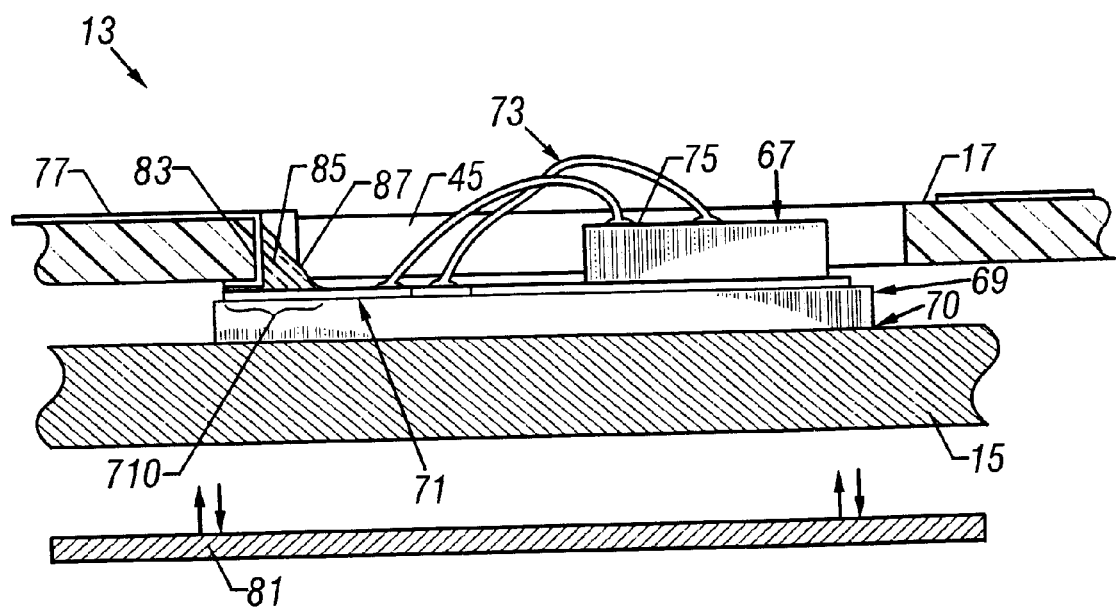
Figure 3:
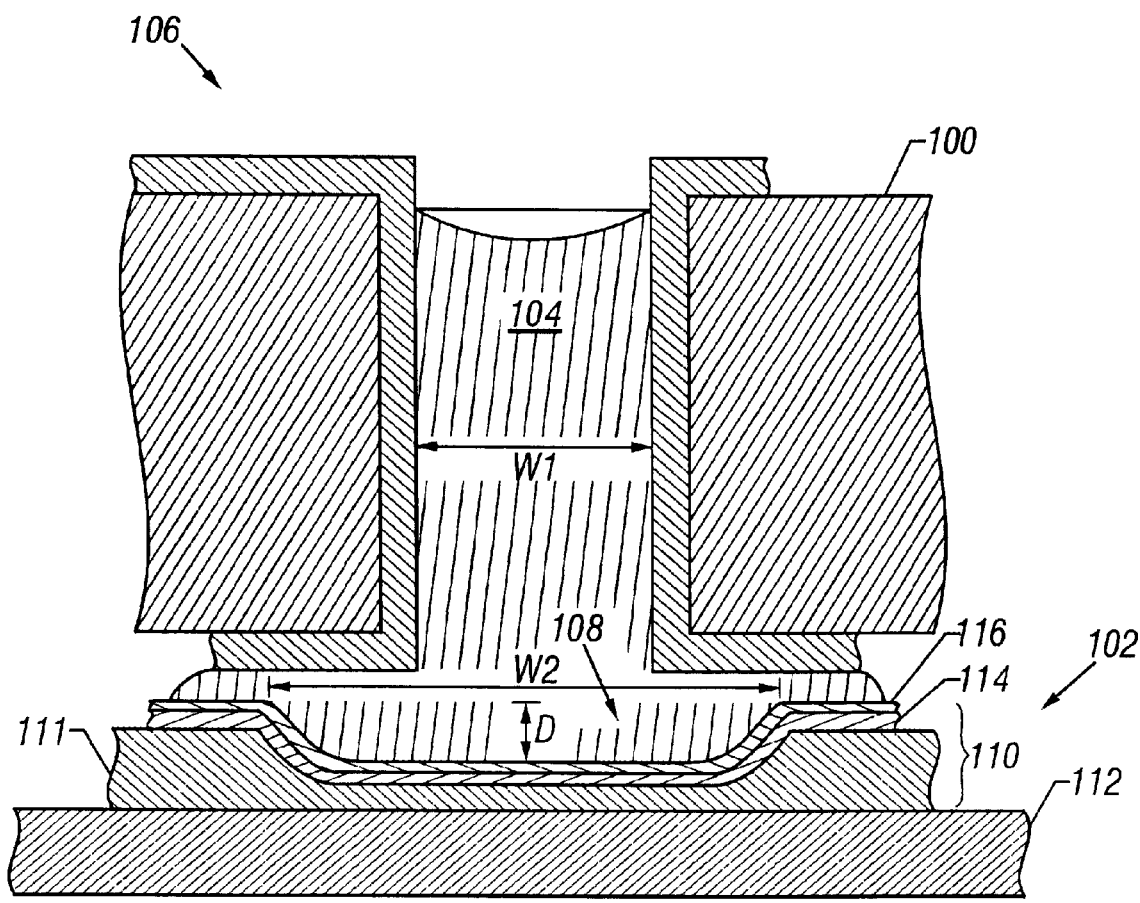
FIG. 3 is an enlarged side sectional view of a solder column.

As shown in FIG. 3, an improved connection between a circuit board 100 and an electrical component such as an IPD 102 is provided by forming a solder post 104 in a copper-lined through-hole 106 with one end of the post extending into a depression 108 in a connection pad 110 of the IPD. Connection pad 110 includes a copper "run" 111 that is direct bonded (DBC) to a ceramic substrate 112. A nickel-gold layer 114 coats the copper run and the entire device is covered with a parylene coating 116.

Post 104 provides a strong electrical and mechanical connection that resists shearing forces during fabrication and use of the associated circuit.

In one implementation, the depression in the copper portion 111 of the connection pad could have a depth D of approximately 0.004 inch in a direct bonded copper connection pad that is 0.005 inch thick and a diameter of 0.030 inch on a pad that is 0.060 inch wide. A wide range of other dimensions is possible. However, if the depression penetrates completely through the connection pad, the solder will not adhere as effectively because the area of the wettable copper surface will have been reduced. Conversely, if the depression is too shallow, the strength of the connection in the face of shear forces may be reduced.

Typical penetration depths, D, for suitable connections are about ⅔ to ¾ of the total thickness of the basis metal. Acceptable performance is achieved by a depth in the range of 0.003 inch to 0.004 inch in a 0.005 inch thick layer 110. The diameter of the contacting hole works well for aspect ratios of 1:1 and 1:2 [W1:W2] where the ratio compares the through-hole diameter, W1, with the depression diameter W2. Examples of measured diameters (W1) for the circuit board through-hole are 0.032"+/−0.001" for a nominal 0.032" specified feature. Examples of measured diameters (W2) for the shallow depression were 0.051" for a nominal 0.050" +/−0.001" feature and 0.041" for a nominal 0.040"+/−0.001" feature.

The connection can be formed by the following steps. After the IPD has been fabricated with the connection pad on its surface and a parylene coating over the entire device, laser ablation is used to cut through the parylene coating and to form a concave curved depression (a connection region) in the surface of the connection pad. Solder paste is applied to the connection pad of the component. After the circuit board is fabricated and before the connection to the component is to be made, a column of solder is formed inside the through-hole using a conventional fountain solder process. After the IPD has been put into place relative to the circuit board and the connection is ready to be made, a conventional re-flow step is used to cause the solder in the through-hole and the solder paste on the connection pad to unite to form an finished uninterrupted column as shown in FIG. 3. The solder joint conformally coats the copper surfaces and develops a wetted joint during the reflow process. The solder joint is can be formed with conventional 63/37 Tin/Lead solder.

Even after being subjected to fifty successive 30 degrees C./minute thermal shocks from −20 degrees C. to 105 degrees C. and fifty additional shocks from −40 degrees C. to 125 degrees C., connections made in this way remained intact. Additional testing found that these features survive in excess of 200 temperature shocks of 30 deg C./min from −20 degrees C. to 105 degrees C.

Although not certain, it is believed that the reason for the strength and durability of the connections is that, to sever the connection, a stress crack at the inter-metallic layer between the solder post and the connection pad (the most likely place for a facture because there the fracture represents a the lower free energy process) would propagate along the curved surface of the depression, a process that would require a greater activation energy than if there were no depression. In addition, the effect of lateral shears is reduced because the solder column continues into the depression.

OTHER EXAMPLES

Other examples are within the scope of the following claims. For example, contours other than a concave depression (e.g., lines, crosses, boxes of smaller dimensions than the depressions discussed above) would also reduce the likelihood of failure of the connection. The same technique can be used in a variety of applications including ball grid array, flip chip, and other high density solder packaging systems. The parylene coating could be replaced by another material or eliminated.

What is claimed is:

1. A connection between a circuit board and a component comprising a through-hole in the board, a contact region on the component, the contact region having a surface bearing a depression, and a continuous solder column having one end that forms a solder joint with an inner wall of the through-hole and another end that forms a solder joint with the contact region.

2. The connection of claim 1 in which the contact region is formed on a connection pad and the depression has a depth that is at least ¾ of the thickness of the connection pad.

3. The connection of claim 1 in which the depression comprises a concave curved depression.

4. The connection of claim 1 in which the component comprises an IPD.

5. The connection of claim 1 in which the component is coated with parylene.

* * * * *

UNITED STATES PATENT AND TRADEMARK OFFICE
CERTIFICATE OF CORRECTION

PATENT NO.    : 6,316,737 B1                                    Page 1 of 1
DATED         : November 13, 2001
INVENTOR(S)   : Michael D. Evans et al.

It is certified that error appears in the above-identified patent and that said Letters Patent is hereby corrected as shown below:

<u>Title page,</u>
Item [56], FOREIGN PATENT DOCUMENTS, 13$^{th}$ reference, change "57-19076" to -- 57-190768 --.

<u>Column 1,</u>
Line 10, change "such as in" to -- such as an --.

<u>Column 2,</u>
Line 46, change "an finished" to -- a finished --.
Line 49, delete "is".
Line 62, change "facture" to -- fracture --.
Line 62, after "represents a" delete "the".

Signed and Sealed this

Fifteenth Day of April, 2003

JAMES E. ROGAN
*Director of the United States Patent and Trademark Office*